United States Patent [19]

Scanlan

[11] Patent Number: 4,743,713
[45] Date of Patent: May 10, 1988

[54] ALUMINUM-STABILIZED NB3SN SUPERCONDUCTOR

[75] Inventor: Ronald M. Scanlan, Livermore, Calif.

[73] Assignee: United States Department of Energy, Washington, D.C.

[21] Appl. No.: 578,897

[22] Filed: Feb. 10, 1984

[51] Int. Cl.[4] ............ H01B 12/00; H01L 39/24
[52] U.S. Cl. ............ 174/128 S; 29/599; 148/11.5 R; 174/126 S; 335/216
[58] Field of Search ............ 174/126 S, 128 S; 29/599; 428/930; 148/11.5 F, 11.5 R; 335/216

[56] References Cited

U.S. PATENT DOCUMENTS

| | | | |
|---|---|---|---|
| 3,509,622 | 5/1970 | Bernert et al. | 29/599 |
| 3,665,595 | 5/1972 | Tanaka et al. | 29/599 |
| 3,778,895 | 12/1973 | Nomura et al. | 29/599 |
| 3,905,839 | 9/1975 | Hashimoto | 29/599 |
| 3,958,327 | 5/1976 | Marancik et al. | 29/599 |
| 3,996,661 | 12/1976 | Ziegler et al. | 29/599 |
| 4,135,293 | 1/1979 | Madsen et al. | 174/126 S X |
| 4,189,693 | 2/1980 | Satti | 335/216 |
| 4,242,536 | 12/1980 | Young | 174/128 S |
| 4,285,120 | 8/1981 | Nomura et al. | 174/126 S |
| 4,377,905 | 3/1983 | Agatsuma et al. | 335/216 X |
| 4,435,228 | 3/1984 | Tachikawa et al. | 428/930 X |

OTHER PUBLICATIONS

Svenaga M. et al.; The Fabrication and Properties of Nb3Sn Superconductors by the Solid Diffusion Process; IEEE Transactions on Magnetics, vol. mag-11, Mar. 1975; 231-236.

*Primary Examiner*—Morris H. Nimmo
*Attorney, Agent, or Firm*—L. E. Carnahan; Roger S. Gaither; Judson R. Hightower

[57] ABSTRACT

An aluminum-stabilized Nb3Sn superconductor and process for producing same, utilizing ultrapure aluminum. Ductile components are co-drawn with aluminum to produce a conductor suitable for winding magnets. After winding, the conductor is heated to convert it to the brittle Nb3Sn superconductor phase, using a temperature high enough to perform the transformation but still below the melting point of the aluminum. This results in reaction of substantially all of the niobium, while providing stabilization and react-in-place features which are beneficial in the fabrication of magnets utilizing superconducting materials.

18 Claims, 2 Drawing Sheets

ALUMINUM-STABILIZED NB3SN SUPERCONDUCTOR

BACKGROUND OF THE INVENTION

The invention described herein arose in the course of, or under, Contract No. DE-AC03-76F00098 between the United States Department of Energy and the University of California.

The invention relates to superconductors, particularly to aluminum-stabilized Nb$_3$Sn superconductors, and more particularly to a method of fabricating magnets of aluminum-stabilized Nb$_3$Sn superconductive material.

Superconducting materials are those materials which exhibit zero resistance when the temperature of the material is lowered below some critical temperature level. At this critical temperature the material undergoes a transition from the normal to the superconducting state. The temperature at which this transition takes place is exceedingly important, that is, a high critical temperature is very desirable.

The phenomenon of superconductivity, which is exhibited by many metals, is of great scientific and commercial value, since it permits various sorts of high-powered devices to operate with minimal losses of electrical power. This phenomenon is defeated by the exceeding of any one of three parameters: (1) a critical temperature, (2) a critical magnetic field, and (3) a critical current. Since the most useful applications of superconductivity involve high currents or fields, it has been the aim of the art of superconductor fabrication to produce conductors with the highest possible critical quantities.

Materials with useful superconducting properties include Nv$_3$Sn, Nb$_3$Ga, V$_3$Ga, Nb$_3$Al and Nb$_3$Ge, for example. The principal difficulty with these materials that has inhibited their acceptance is their inherent brittleness, that is, they easily fracture when stressed. A superconductor must be capable of being wound into a solenoid or magnet without subsequent deterioration in its properties, such as would occur if the superconductive compound would fracture during winding.

It has been well known in the art that one way to increase the operating parameters is to "stabilize" it by providing a normally conductive alternate current path, so that if the superconductive should "go normal" (i.e. return to the normally conducting state) the current will have a shunt path. In this way higher currents can be passed through the superconductor without fear of momentary local variations in the current or magnetic field destroying the superconductor within a time in which it can regain its superconductive properties.

It is also well known in the at that the tendency of superconductors to go normal is ordinarily a local phenomenon. Hence, it is important to locate the shunt in close physical proximity to the superconductor, in order that the whole of the current need not be diverted.

Bearing these recognized points in mind, much effort has been directed to various approaches to obtain the desired critical features in the manufacture of superconductors. These prior efforts are exemplified by the following U.S. Pat. No. 3,509,622 issued May 5, 1970 to R. E. Bernert et al; No. 3,665,595 issued May 30, 1972 to E. Tanaka et al; No. 3,778,895 issued Dec. 18, 1973 to H. Nomura et al; No. 3,905,839 issued Sept. 16, 1975 to Y. Hashimoto; No. 3,958,327 issued May 25, 1976 to W. G. Marancik et al; and No. 4,242,536 issued Dec. 30, 1980 to M. S. Young.

The practical application of superconductors to the construction of magnets requires a high conductivity normal metal such as copper or aluminum to be used in conjunction with the superconductor for stabilization and protection. For many applications, aluminum would be a better choice than copper because aluminum has a much higher conductivity at cryogenic temperatures than copper, and maintains this conductivity in high magnetic fields because of its lower magnetoresistance. However, aluminum has not found extensive use in Nb$_3$Sn magnets (particularly wind-and-react magnets) because the required reaction or transformation temperature of 700° C., previously used, is above the melting point of aluminum. Thus, a need has existed for a method of fabricating superconductors utilizing aluminum as a stabilizer wherein the reaction or transformation temperature is below the melting point of the aluminum and particularly for a method of producing react-in-place magnets utilizing aluminum-stabilized Nb$_3$Sn superconductive material.

Therefore, it is an object of this invention to provide an aluminum-stabilized Nb$_3$Sn superconductor.

A further object of the invention is to provide a process to produce a Nb$_3$Sn superconductor stabilized with ultrapure aluminum.

Another object of the invention is to provide a method for producing superconducting magnets involving both stabilized and react-in-place features.

Another object of the invention is to provide an aluminum-stabilized Nb$_3$Sn superconductive material which can be cabled, braided, or wound as a single strand into a magnet.

Still, another object of the invention is to provide a react-in-place method of producing an aluminum-stabilized Nb$_3$Sn superconductive magnet.

Other objects and advantages of the present invention will become readily apparent to those skilled in the art from the following description and accompanying drawings.

SUMMARY OF THE INVENTION

The above-listed objects and advantages are accomplished by this invention by providing an aluminum-stabilized Nb$_3$Sn superconductive material which can be formed, for example, into a magnet utilizing a react-in-place feature, and wherein the transformation temperature is below the melting point of aluminum.

In a more narrow aspect of the invention, a composite of niobium rods in a copper matrix is fabricated in the form of a hollow tube and a tin rod is inserted into the tube. This composite is then drawn down. Thereafter, a number of the drawn down composites are assembled with an aluminum component and co-drawn to a final size wherein the precursor niobium rods have diameters of 1 micron or less. The aluminum component can be isolated from the other components by a suitable diffusion barrier such as tantalum. The final heating step to form the aluminum-stabilized superconductor is the same as described above, using a transformation temperature of about 600°–650° C., but below the melting point of pure aluminum. Due to the small diameter of the niobium rods substantially all of the niobium is reacted to form Nb$_3$Sn.

DETAILED DESCRIPTION OF THE INVENTION

This invention involves an aluminum-stabilized Nb$_3$Sn superconductor, which is particularly applicable for use in magnets, and to a method of fabricating same. The invention provides for stabilization and react-in-place features of Nb$_3$Sn magnet stabilized by ultrapure aluminum. More specifically, the invention involves a method for fabricating an aluminum-stabilized Nb$_3$Sn superconductor wherein the precursor niobium rods or filaments are drawn to very small diameters (e.g. 5 microns or less), whereby substantially all of the niobium is reacted to form Nb$_3$Sn, at temperatures (600°-650° C.) below the melting point of the aluminum (660.2° C.).

Figure 1:
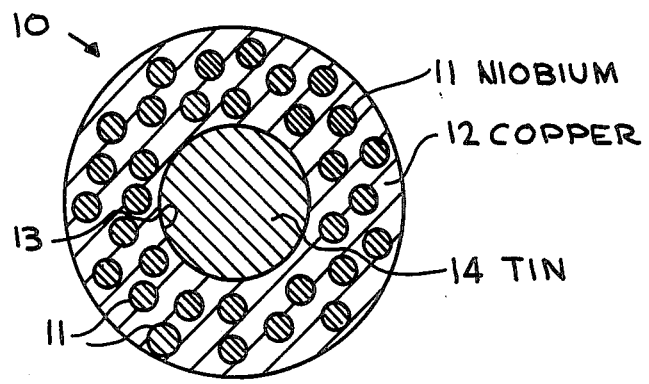
FIG. 1 shows, in cross-section, a composite of components utilized in the process of this invention.

The process to fabricate the stabilized Nb$_3$Sn superconductor is as described below. As shown in FIG. 1, a composite indicated at 10 consists of niobium (Nb) rods or filaments 11 in a copper (Cu) matrix 12 fabricated in the form of a hollow tube having opening 13 with a tin (Sn) rod 14 inserted in the opening 13. The composite 10 is drawn down to form a basic unit or building block.

Composites 10 are drawn down, for example, by the following techniques: The composite is processed at temperatures below 200° C. in order to avoid melting of the Sn. Extrusion and/or drawing are employed to reduce the composite in cross section.

Figure 2:
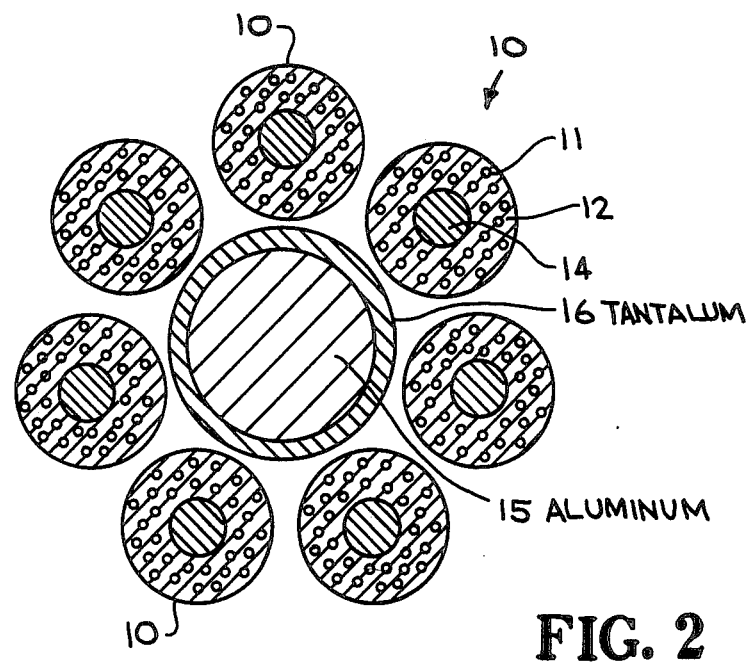
FIGS. 2-4 illustrate, in cross-section, embodiments of components of the superconductor of this invention prior to the final heating step of the fabrication process of the invention.

A number of the drawn down units or composites 10 are then assembled around a high conductivity aluminum (Al) component 15, as by wrapping or winding, as shown in FIG. 2. The Al component 15 is isolated from the units 10 by a suitable diffusion barrier 16, such as a layer of tantalum (Ta). The diffusion barrier 16 prevents contamination of the Al by other components, such as the Sn or Cu in the basic units 10, which would destroy the high conductivity. The assembly as shown in FIG. 2 (the units 10, aluminum component 15 and diffusion barrier 16) are co-drawn to form a conductor of final size, at which point the Nb rods or filaments 11 are 5 microns or less in diameter (preferably not greater than 1 micron). Again, reduction is accomplished by drawing at temperatures below 200° C.

By way of example, the Nb rods or filaments 11 may have a diameter of 3 mm to 25 mm; the Cu matrix 12 may have 100 to 1,000 Nb rods therein, an outer diameter of 25 mm to 250 mm with the opening 13 having a diameter of 5 mm to 10 mm; the Sn rod 14 having an outer diameter corresponding to, but slightly less than, the diameter of opening 13; the aluminum component 15 may have a diameter of 5 mm to 100 mm, and a purity of 99.999%; and the diffusion barrier 16 may have an outer diameter of 6 mm to 110 mm and wall thickness of 1 mm to 10 mm. In the embodiment of FIG. 2, there are seven (7) composite units 10 located about the diffusion barrier 16, but this number can range from 6 to 100, depending on the diameter of each unit 10 and the diameter of the diffusion barrier 16. Also, the diffusion barrier may also be constructed of molybdenum (Mo) or niobium (Nb).

The conductor of FIG. 2, after it has been co-drawn down as described above, may be cabled, braided or wound into a magnet, as known in the art. After the conductor is physically configured, such as being wound as a single strand into a magnet, it is heated to a temperature between 600°-650° C. to convert, react, or transform (react-in-place) the Nb into a Nb$_3$Sn superconductor. Heating can be accomplished in a vacuum or inert gas atmosphere furnace.

Since the melting point of Al is 660.2° C., the transformation temperature is below that point, whereby the high conductivity of the Al is not adversely affected or the Al component melted. This results in an aluminum-stabilized Nb$_3$Sn magnet, thus reducing, if not eliminating the problems associated with the superconductor quenching or reverting back to the normal state.

Figure 3:
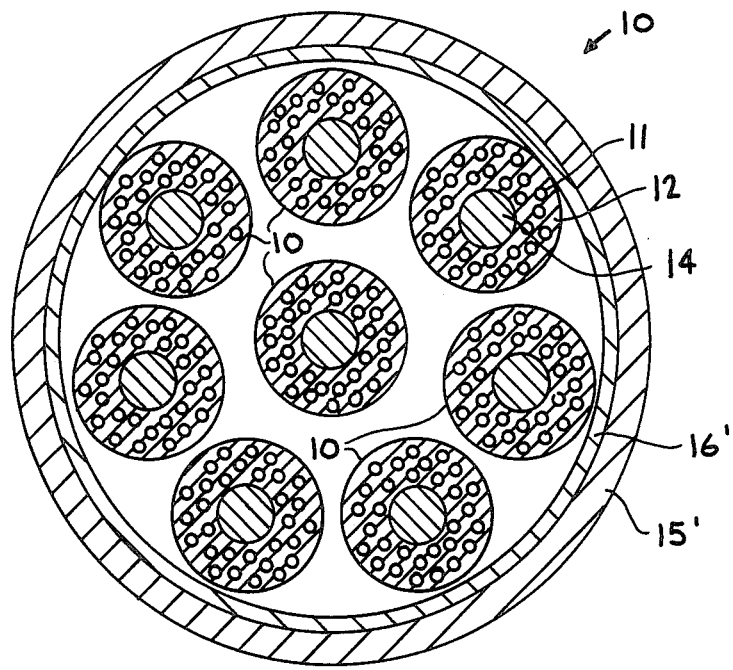
Figure 4:
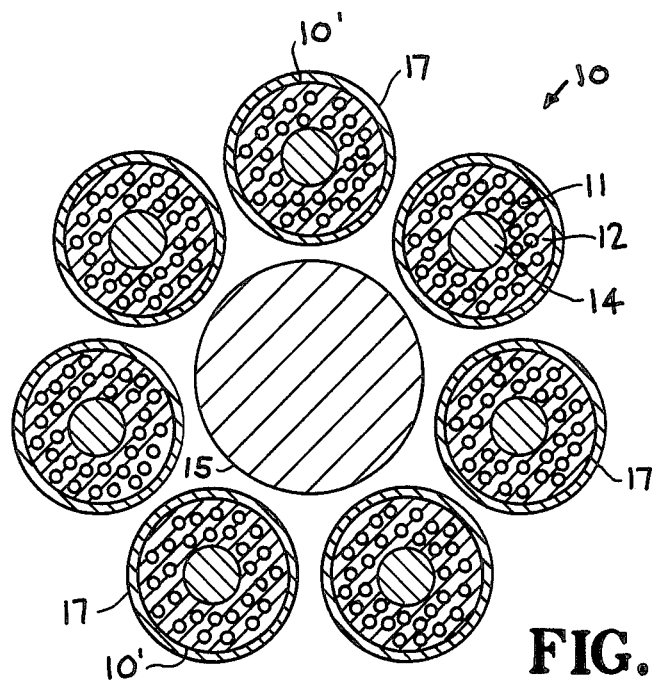

While the aluminum component 15 has been illustrated in FIG. 2 as a central core member with the diffusion barrier 16 forming a ring therearound, as shown in FIG. 3 the aluminum component may form an outer casing or 15' ring having the diffusion barrier 16' located therein to separate the aluminum component from the copper matrix components. Also, as shown in FIG. 4, each of the individual units 10' may be surrounded by a diffusion barrier 17. In each case the diffusion barrier would protect the high conductivity of the aluminum from being destroyed by contamination of the tin or copper components.

It has thus been shown that the present invention overcomes the problems of the prior art by providing an aluminum-stabilized Nb$_3$Sn superconductive material which can be utilized in various configurations, including being wound as a magnet, the reaction or transformation phase of the forming process being carried out after the desired configuration is formed.

While a particular embodiment of components and sequence of operational steps or procedures for producing the superconductor of the invention have been illustrated or described, such are not intended to be limiting, since modifications will become apparent to those skilled in the art, and it is intended to cover in the appended claims all such modifications as come within the scope of this invention.

I claim:

1. An aluminum-stabilized Nb$_3$Sn superconductive material for use in a superconductor, said material consisting essentially of:
   a plurality of composite units, each unit consisting of:
   a member of a first conductive material having a hollow central section and a plurality of openings therein,
   a plurality of niobium rods positioned in said openings of said member, and
   a tin rod located in said hollow central section of said member;
   a member of a second conductive material;
   said plurality of composite units being located about and spaced from said member of a second conductive material; and
   diffusion barrier means located intermediate said member of a second conductive material and said plurality of composite units.

2. The superconductive material of claim 1, wherein the member of a first conductive material consists of copper and the member of a second conductive material consists of aluminum.

3. The superconductive material of claim 2, wherein said aluminum member comprises a central core, said plurality of composite units being positioned around said aluminum member, and said diffusion barrier means being configured as a layer between said aluminum member and said composite units.

4. The superconductive material of claim 2, wherein said aluminum member consists of substantially pure aluminum.

5. The superconductive material of claim 2, wherein said niobium rods have a diameter of not greater than 5 microns.

6. The superconductive material of claim 2, wherein said aluminum member comprises a central core, said plurality of composite units being positioned around said aluminum member, and said diffusion barrier means being configured as a layer around each of said composite units.

7. A method for fabricating an aluminum stabilized Nb3Sn superconductor comprising the steps of:
   positioning a plurality of Nb-Cu-Sn composite components in spaced relation with respect to an aluminum member by locating the composite components around an outer surface of the aluminum member;
   positioning diffusion barrier material intermediate the composite components and the aluminum member;
   co-drawing down the thus assembled assembly to form a conductor;
   forming the conductor in a configuration; and
   heating the thus formed conductor to convert components thereof to form a superconductor phase without causing melting of the aluminum member.

8. The method of claim 7, wherein the step of heating is carried out at a temperature range of 600°–650° C.

9. The method of claim 7, additionally including the step of forming the plurality of Nb-Cu-Sn composite components.

10. The method of claim 9, wherein the step of forming the Nb-Cu-Sn composite components is carried out by:
    providing a copper matrix having a tube shaped configuration and a plurality of openings therein,
    positioning a niobium rod in each of the plurality of openings in the copper matrix,
    placing a tin rod within the tube shaped copper matrix, and
    drawing down the thus assembled matrix and rods to form a composite niobium-copper-tin component.

11. The method of claim 7, wherein the step of positioning the diffusion barrier is carried out by providing a layer of the diffusion barrier material around the aluminum member and within the plurality of composite components.

12. The method of claim 7, wherein the step of positioning the diffusion barrier is carried out by providing a layer of the diffusion barrier material around each of the composite components.

13. The method of claim 7, additionally including the step of forming the aluminum member as a central core, and wherein the step of positioning the plurality of composite components with respect to the aluminum member is carried out by wrapping the composite components around the aluminum core.

14. The method of claim 7, additionally including the step of forming the diffusion barrier material from material selected from the group consisting of tantalum, molybdenum and niobium.

15. The method of claim 7, wherein the step of forming the conductor in a configuration is carried out by winding the conductor as a single strand into a coil for a magnet.

16. The method of claim 7, wherein the step of co-drawing down is carried out such that the Nb of the Nb-Cu-Sn composite components forms a plurality of Nb filaments having a diameter of not greater than 5 microns.

17. A react-in-place method for forming aluminum-stabilized Nb3Sn superconductive magnets comprising the steps of:
    assemblying a plurality of Nb-Cu-Sn composite components wherein the Nb constitutes a plurality of filaments located in a matrix of Cu and the Sn constitutes a rod located centrally in the Cu matrix;
    positioning the plurality of Nb-Cu-Sn composite components around a core member composed of substantially pure aluminum;
    positioning a diffusion barrier intermediate the aluminum core member and the Nb-Cu-Sn composite components for preventing contamination of the aluminum by the material of the composite components;
    co-drawing down the thus assembled core member, diffusion barrier, and composite components into a conductor wherein the Nb filaments have a diameter not greater than 5 microns;
    winding the thus formed conductor as a single strand into a magnet; and
    applying the heat to the thus wound magnet in the temperature range of 600°–650° C., whereby substantially all of the Nb is reacted-in place to form a superconductor of Nb3Sn stabilized by aluminum.

18. The method of claim 17, wherein the diffusion barrier is composed of tantalum.

* * * * *